United States Patent [19]

Lee et al.

[11] Patent Number: 4,871,692

[45] Date of Patent: Oct. 3, 1989

[54] PASSIVATION OF GROUP III-V SURFACES

[76] Inventors: Hong H. Lee, 9221 NW. 9th Ave., Gainesville, Fla. 32606; Sang H. Lee, 6519 Newberry Rd., #914, Gainesville, Fla. 92605

[21] Appl. No.: 251,521

[22] Filed: Sep. 30, 1988

[51] Int. Cl.$^4$ .................. H01L 21/00; H01L 21/02; H01L 21/306; H01L 21/31
[52] U.S. Cl. .................................. 437/235; 437/225; 148/33.3; 148/33.4
[58] Field of Search ............................ 148/33.3, 33.4; 437/235

[56] References Cited

FOREIGN PATENT DOCUMENTS 0068936 4/1983 Japan .

Primary Examiner—Brian E. Hearn
Assistant Examiner—B. Everhart
Attorney, Agent, or Firm—Dennis P. Clarke

[57] ABSTRACT

A method of passivating a Group III-V compound surface by exposing the surface to a compound A-B, wherein A is an element having a heat of oxide formation greater than the heats of oxide formation of Group III and V elements and B is an element: S, Se, Te or Po.

3 Claims, 6 Drawing Sheets

PASSIVATION OF GROUP III-V SURFACES

BACKGROUND OF THE INVENTION

1. Field of the Invention

The present invention relates to the passivation of Group III-V surface layers and in particular, GaAs.

2. Description of the Prior Art

Gallium arsenide and other Group III-V type semiconductor materials are highly valued for fabricating high performance semiconductor components. These materials, however, are susceptible to environmental degradation. The poor electric quality of the degraded III-V surfaces is caused by the high density of the surface states thereon created by oxidation reactions. Deep level traps are produced as a result of oxidation which pin the Fermi level and increase non-radiative recombination.

These arsenic atoms are the main cause for the deep level traps which pin the Fermi level and increase the non-radiative recombination [Aspnes, Surf. Sci., Vol. 132, p 406 (1983); Henry et al, J. Appl. Phys. Vol. 49, p.3530 (1978); Chang et al, Appl. Phys. Lett., Vol. 33, p. 341 (1978)]. This inherent problem has limited the performance of existing GaAs based electronic and electrooptical devices and has still prevented the successful development of GaAs based electronic and electro-optical devices and has still prevented the successful development of GaAs-based MIS technology.

The principal culprit in degradation of III-V surfaces is the presence of oxygen that is difficult to exclude. In the case of GaAs, the presence of oxygen causes oxidation of GaAs to arsenic oxide and gallium oxide. The gallium atoms in the vicinity of the arsenic oxide gradually extract oxygen from arsenic oxide to form gallium oxide, leading to the segregation of the arsenic atoms.

Recently, there has been a renewed interest in improving the poor electronic quality of GaAs surface [Offsey et al, Appl. Phys. Lett., Vol. 48, p. 475 (1986); Sandroff et al, Appl. Phys. Lett., Vol. 51, p. 33 (1987); Skromme et al, Appl. Phys. Lett., Vol. 51, p. 2022 (1987) and Yablonovitch et al, Appl. Phys. Lett., Vol. 51, p 439 (1987)] which is caused by the high density of surface states on GaAs formed by segregated arsenic atoms [Spicer et al, J. Vac. Sci., Techol., Vol. 16, p. 1422 (1979)] via oxidation reactions [Lee et al, Electrochem., Vol. 135, p. 496 1988)].

Known surface passivation methods for III-V compound semiconductors of which GaAs is the most important and the most difficult to passivate are of three types.

The first method utilizes deposited films such as $SiO_2$, $Si_3N_4$, $Al_2O_3$ and $P_2O_5$ which are known from their use as passivation films for the surfaces of silicon semiconductors. These approaches suffer from the drawback that the deposition temperature is relatively high. $SiO_2$ films tend to take in Ga from the surface of a substrate made of GaAs or GaP, and will damage the stoichiometry of the surface of the substrate.

The second method is to form a native oxide film corresponding to a thermal oxidation film of silicon, in place of the deposited film suggested above by, for example, an anodic oxidation method. Anodic oxidation methods have the disadvantage that they are thermally unstable. The quality of the film will change substantially at a temperature below the temperature range adopted for thermal diffusion of impurities and post-ion implantation annealing.

The third approach is to perform chemical oxidation by the use of, for example, hot hydrogen peroxide solution. This method is disadvantaged by limitation in the thickness of the oxide film which is formed.

The success of any passivating technique hinges on choosing a species that makes a strong bond with the surface and at the same time has a higher heat of oxide formation than that of gallium oxide since the thermodynamic equilibrium of the composition greatly favors the formation of gallium oxide over arsenic oxide because of the higher heat of formation of gallium oxide. The first requirement can be satisfied by choosing a chemical species that absorbs strongly on the GaAs surface as an impenetrable passivating barrier. Thus, a species that chemisorbs strongly must be chosen. A chemisorbing species such as phosphorus compounds occupies the active surface sites, thereby preventing adsorption of other species.

It is an object of the invention to provide a novel and efficient method of passivating Group III-V surfaces that does not suffer from the drawback associated with prior art of passivation methods.

SUMMARY OF THE INVENTION

The above and other objects are realized by the present invention, one embodiment of which provides a method of passivating a surface of a Group III-V compound substrate comprising exposing the surface to a compound having the formula A-B, wherein A is an element having a heat of oxide formation greater than the heats of oxide formation of Group III and V elements and B is an element selected from the group consisting of S, Se, Te and Po, the compound A-B preferably being a member selected from the group consisting of $P_2S_5$, $P_2Se_5$, $P_2Te_5$ and $P_2Po_5$ and mixtures thereof for a time sufficient for deposition/chemisorption thereon of an amount of $P_2S_5$ sufficient to prevent formation of segregated surface atoms and oxides, thereby minimizing the density of surface states and unpinning pinned Fermi levels thereof.

An additional embodiment of the invention comprises an article of manufacture comprising a Group III-V compound substrate, the surface of which has been passivated by the above-described method.

DETAILED DESCRIPTION OF THE INVENTION

Density of states may be defined as the number of energy levels per unit volume. The excess states (energy levels) present at III-V surfaces due to segregated atoms on the surfaces and to some extent oxides are commonly referred to as high density of surface states. The deleterious effects of high density of surface states are current leakage, Fermi-level pinning and an increase in non-radiative recombination. The segregated atoms and oxides form due to chemical reactions taking place at the surfaces.

A clean III-V semiconductor surface has, in general, a few (usually two) free valence electrons. A passivating agent should have an element that can form bonding with the free electrons and another element whose heat of oxide formation is larger than the heats of oxides formation of the Group III,V elements. An example is $P_2S_5$. The use of a solvent that promotes formation of a complex ion of $P_2S_5$ is also desirable. Other examples are $P_2Se_5$, $P_2Te_5$ and $P_2Po_5$.

The present invention is based on the discovery that exposure of Group III–V, e.g., GaAs, surfaces to $P_2S_5$ forms a chemisorbed, passivating layer thereon which significantly lowers the density of surface states thereof. The heat of formation of $P_2O_5$, but not necessarily of other oxides of phosphorous, is much higher than that of $Ga_2O_3$ which apparently contributes to the passivation effect.

Figure 1:
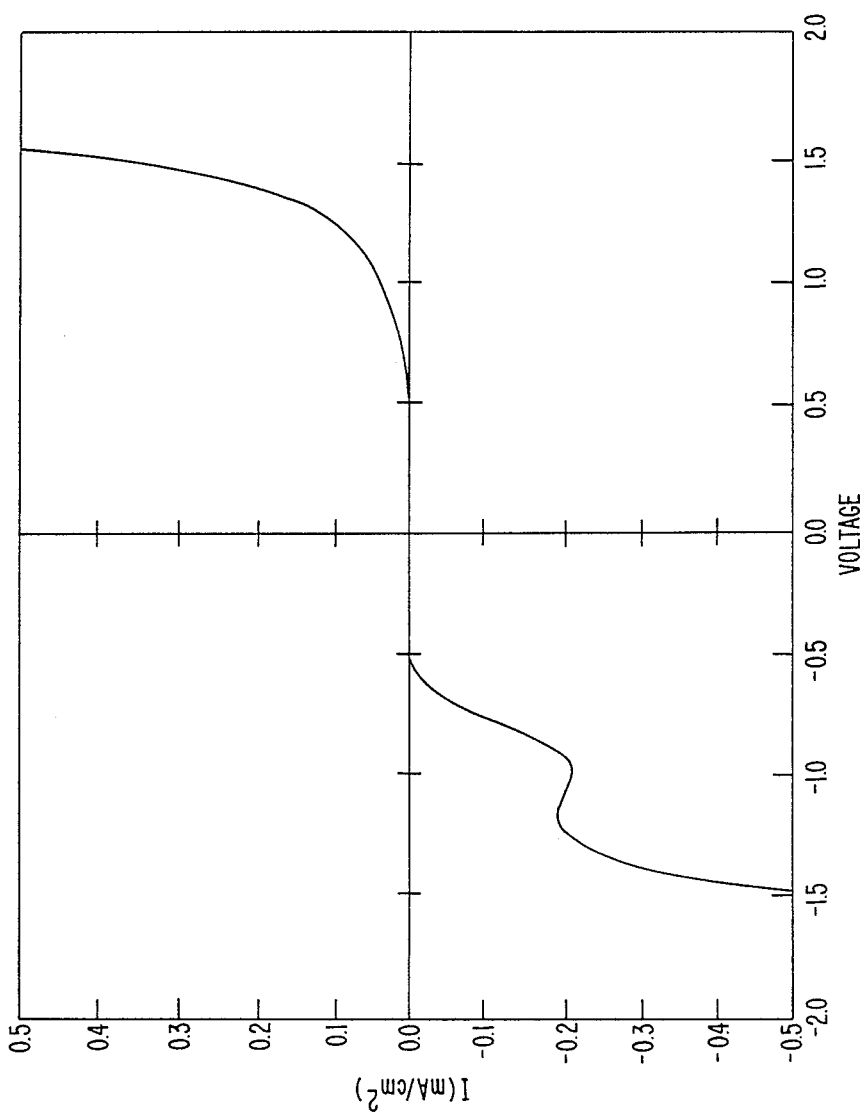
FIGS. 1–5 depict electrochemical current-voltage profiles of variously treated GaAs surfaces.

It will be understood by those skilled in the art that the present invention is applicable for the passivation of any other Group III–V surface, e.g., InP, InSb, AlP, GaP, InAs, AlAs, AlSb, GaSb, etc.

Principally, however, the invention is valuable for the passivation of surfaces comprising GaAs.

By the term, "chemisorption" is meant the adsorption and substantially irreversible holding by chemical forces of the passivating species by the Group III–V species.

Prior to passivation, the Group III–V surface is typically cleaned, etched and otherwise processed or modified according to conventional and techniques well known to those skilled in the art and which will not be described in detail herein.

The invention is illustrated by the following non-limiting Examples.

EXAMPLE 1

The samples used in the experiments described below are silicon-doped, liquid encapsulated Czochralski grown GaAs with a (100) orientation. The doping level was $1.5 \sim 2.3 \times 10^{18}/cm^3$ with a resistivity of $0.0015 \sim 0.0021$ ohm-cm and a mobility of $1475 \sim 1834$ $cm^2/volts$. The sample wafers were first cleaned, with a subsequent rinsing in trichloroethane, acetone, methanol, and de-ionized (DI) water. Various etching solutions were investigated based on sulfuric acid or ammonium hydroxide mixtures. Best results were obtained from a mixture of $HN_4OH:H_2O_2$ in a reaction rate limited composition. This is believed to be due to $Ga_2O_3$ being more readily soluble in alkaline-based etchants. Wet etching usually leaves behind a layer of a mixture of lower oxides and other compounds. To remove the interfacial oxides of gallium and arsenic, the samples were immersed in concentrated $NH_4OH/H_2O(1:2)$ solution, followed by a brief dip of the sample in a diluted $HN_3/H_2O(1:19)$ solution for removal of arsenic. For further removal of arsenic, the samples were subjected to photochemical activation (254 nm) of the surface while squirting with deionized water. The samples thus prepared were then dipped directly into a passivating solution and blow-dried with nitrogen after removal from the solution. The solutions used were $PCl_3$ in water and $P_2S_5$ dissolved in $NH_4OH$. Photoluminescence (PL) intensity measurements and current-voltage (I-V) profiles (FIGS. 1–5) were obtained for both the passivated and unpassivated (but cleaned) samples. The room temperature PL measurements were made with an argon laser at a wavelength of 488 nm and an output power of 350 mW. The I-V profiles were obtained with an electrochemical semiconductor profiler system (Polaron 4200 from Bio-Rad). The system uses an electrochemical cell containing an electrolyte. It employs an electrochemical Schottky contact, which is equivalent to the conventional metal Schottky contact, on the polished side of GaAs wafer while ohmic contacts are made by pressure on the other side.

The results of the PL measurements before and after various treatments are summarized in Table 1.

TABLE 1

| Sample | Increase of the relative room temperature PL intensity after various chemical and photochemical treatments | |
|---|---|---|
| | Normalized PL intensity after treatment | Normalized PL intensity after 10 days in room air |
| unpassivated c | 1 | 1 |
| unpassivated c, e | 1 | 1 |
| unpassivated c, e, $NH_4OH$ | 1 | 1 |
| unpassivated c, e, $HNO_3$ | 1.4 | 1 |
| unpassivated c, e, DI | 1.4 | 1 |
| passivated, $P_2S_5/NH_4OH$ | 5 | 5 |
| passivated, $PCl_3$ | 3.5 | 2.5 |
| passivated, $Na_2S.9H_O/H_2O$ | 5 | 3.5 | c - cleaning
e - etching
DI - Activated DI washing.

The PL intensity from unpassivated (but cleaned) samples is the reference for the normalization. As shown in the table, the PL intensity for the $P_2S_5/NH_4OH$ treated sample increased by a factor of 5 as a result of the passivation. Further, the PL intensity does not decrease even after 10 days' exposure to room air. The sample was left as originally mounted in air and the PL intensity was periodically measured from the same spot. The result for $PCl_3$ shows that the PL intensity increases by a factor of 3.5 but then gradually decreased to 2.5 after 10 days' exposure to room air, indicating some segregation of arsenic atoms. Because of recent passivation success reported in the literature based on sodium sulfides [Offsey et al, supra; Sandroff et al, supra and Skromme et al, supra], the samples treated with $Na_2S.9H_2O$ were also tested. The result in the table shows that the PL intensity increased by a factor of 5 but then decreases to 3.5 after 10 days. It is of interest to note from Table 1 that the cleaning procedures with $HNO_3$ or activated deionized water washing are more effective than with $NH_4OH$. It should be noted in this regard that the increase in PL intensity depends on the solution concentration for most of the passivating agents.

Figure 2:
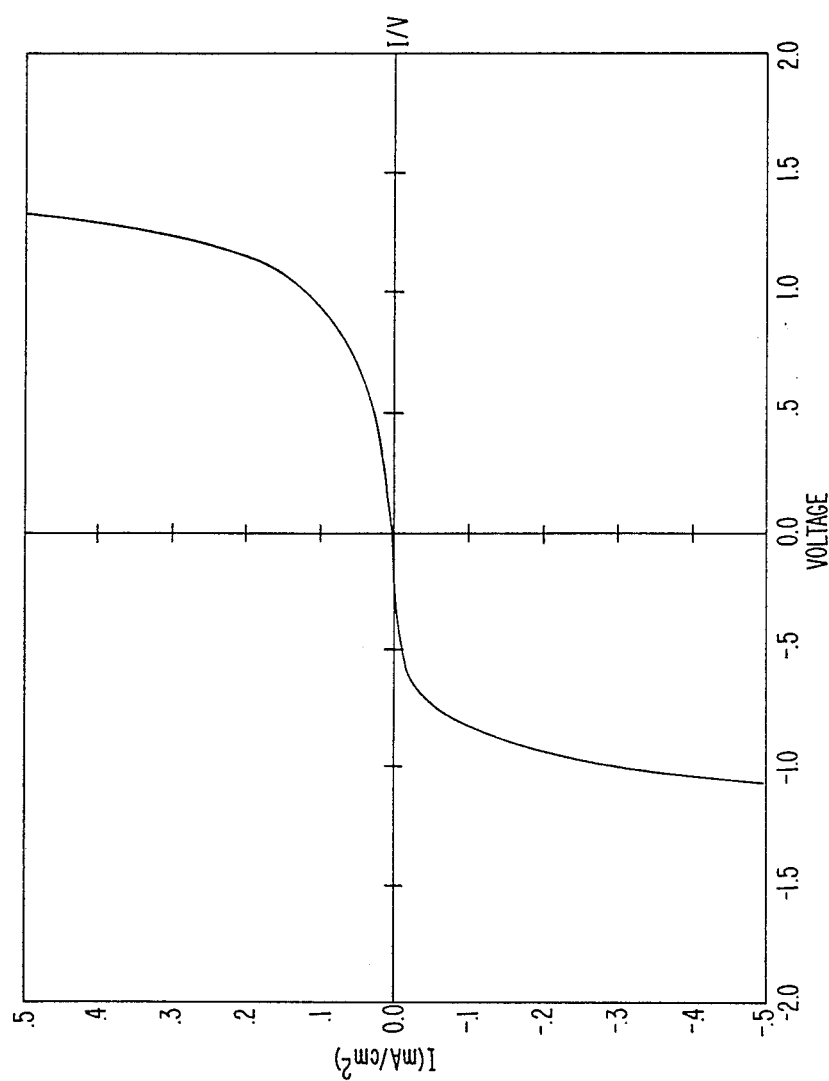
Figure 3:
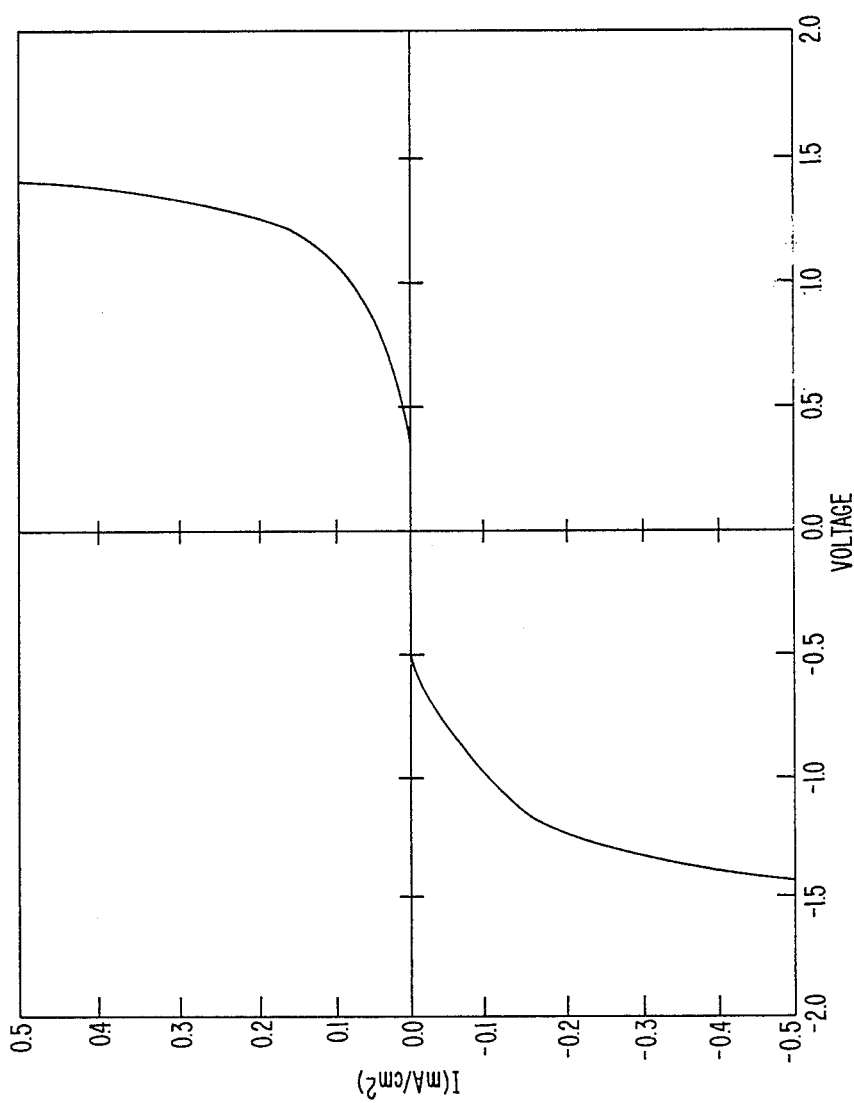
Figure 4:
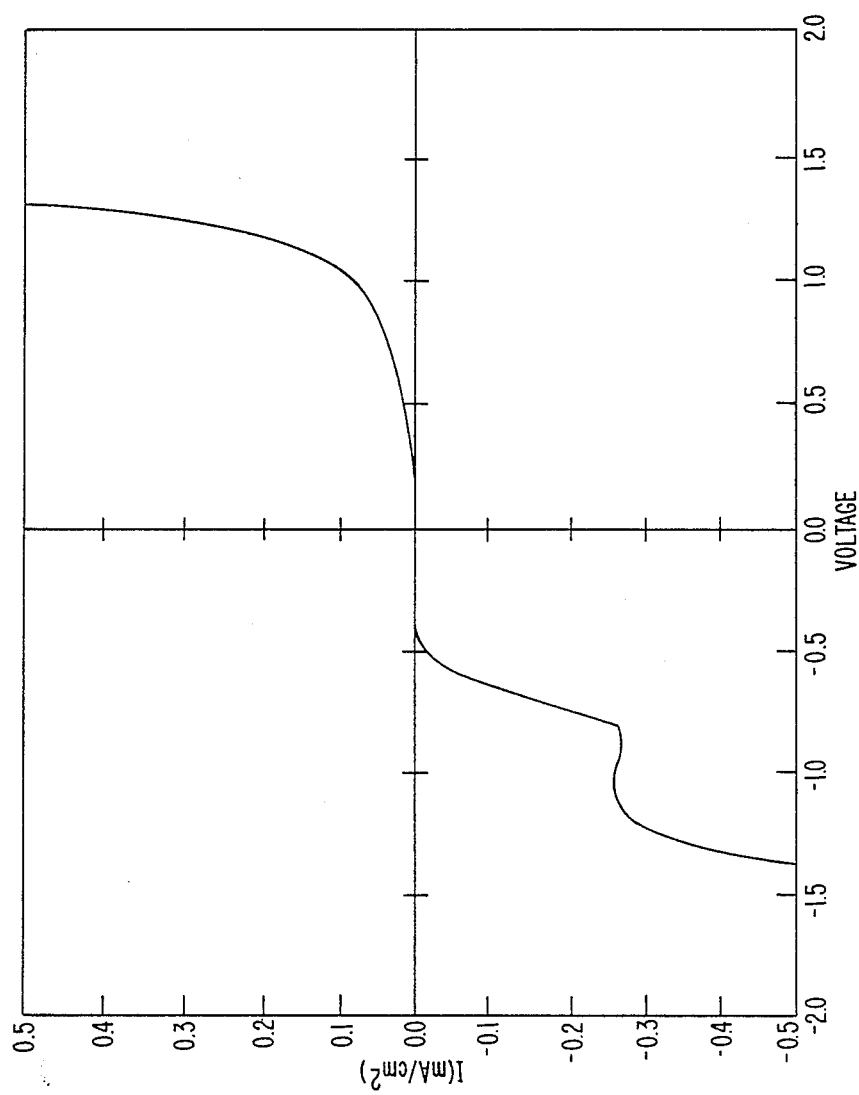
Figure 5:
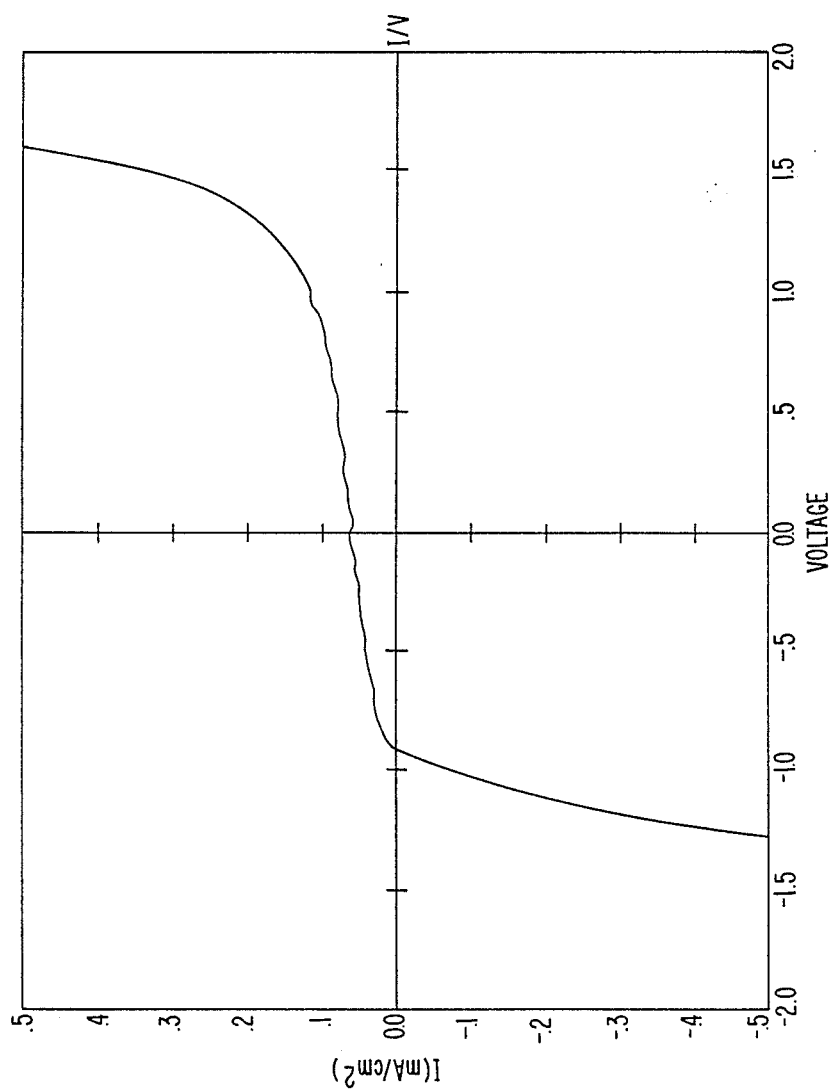

The results for the I-V profiles are shown in FIGS. 1–5. FIG. 1 shows the typical profile for the unpassivated sample. The decrease in the current at around $-0.9$ V biased level (but forward bias for the n-type sample) is attributed to secondary reactions taking place on the surface, which in turn lead to electronically active segregated atoms and oxides. FIG. 2 shows the profile for $P_2S_5/NH_4OH$ passivated sample that had been exposed to room air for seven days. It is seen that the dip in the I-V profile for the unpassivated sample is no longer there and a smooth I-V profile results. The disappearance of the dip that is characteristic of absence of surface chemical reactions is additional evidence of a passivated GaAs surface. The I-V profile obtained after one-month's exposure to air is almost identical to that in FIG. 2 and thus is not shown here. The I-V profile of a sample right after passivation with PCl₃ is shown in FIG. 3. A very slight dip around −0.8 V is barely detectable but in general the profile is smooth. The effect of exposing PCl₃-treated sample to room air (7 days) on the profile is readily recognizable in FIG. 4. It is seen that the decrease in the current around −0.8 V bias level is quite evident. Although not shown here, the dip becomes gradually bigger with time. The I–V profile right after the treatment with Na₂S.9H₂O is shown in FIG. 5. A residual current at zero bias is notable. Although not shown herein, the I–V profile of Na₂S.9H₂O treated sample changes its I–V characteristic after seven days' exposure to room air [Racicot, "Surface Passivation of GaAs", M.S. Thesis, Dept. of Chem. Eng., Univ. of Fla., Gainesville, Fla. (1987)]. After seven days, the zero-basis current decreases and a very slight dip around −1.0 V appears.

It can be concluded from the PL and I–V measurements that GaAs surface can be successfully passivated with $P_2S_5$. Further, the passivated surface is very robust in the sense that the increase in the PL intensity remains the same and the I–V characteristic shows no sign of surface reactions degrading the chemical state of the surface after more than seven days' exposure to room air. It can reasonably be concluded that $P_2S_5$ or a complex ion of $P_2S_5$ bonded to the surface is responsible for the passivation.

Figure 6:
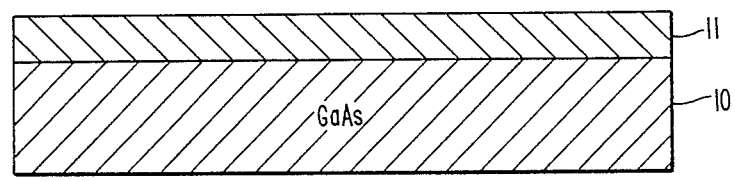
FIG. 6 shows a cross-sectional view of a substrate according to the invention.

Referring to FIG. 6, substrate 10 may be composed of any suitable semiconductor material comprising a Group III–V alloy, typically GaAs on which is disposed passivating layer 11, composed of $P_2S_5$ layer.

Although the invention has been described in detail with reference to the use of ammonium hydroxide solutions of $P_2S_5$, it will be understood by those skilled in the art that any solution of $P_2S_5$ which is non-deleterious to the III–V surface to be passivated and which results in deposition of $P_2S_5$ onto the III–V surface may be employed.

For example, ion sputtering of $P_2S_5$ onto clean III–V compound surfaces can be used. Any deposition technique such as plasma deposition can be used for the passivation, provided the surface is clean and no oxides form on the surface prior to the deposition.

Where ammonium hydroxide solutions of $P_2S_5$ are utilized any concentration of $P_2S_5$ may be utilized.

We claim:

1. A method of passivating a surface of a Group III–V compound substrate comprising exposing said surface to a compound selected from the group consisting of $P_2S_5$, $P_2Se_5$, $P_2Te_5$ and $P_2PO_5$ for a time sufficient for deposition and chemisorption thereon of an amount of said compound sufficient to prevent formation of segregated surface atoms and oxides, thereby minimizing the density of surface states thereof.

2. The method of claim 1 wherein said surfaces exposed to said compound by contacting said surface with an alkaline solution containing said compound.

3. The method of claim 2 wherein said alkaline solution is an ammonium hydroxide solution of $P_2S_5$.

* * * * *